United States Patent [19]

Harper et al.

[11] 4,424,104

[45] Jan. 3, 1984

[54] SINGLE AXIS COMBINED ION AND VAPOR SOURCE

[75] Inventors: James M. E. Harper, Yorktown Heights; Alan W. Kleinsasser, Putnam Valley, both of N.Y.

[73] Assignee: International Business Machines Corporation, Armonk, N.Y.

[21] Appl. No.: 493,871

[22] Filed: May 12, 1983

[51] Int. Cl.$^3$ .............................................. C23C 15/00
[52] U.S. Cl. ........................... 204/192 N; 204/192 R; 204/298
[58] Field of Search ............................ 204/192 N, 298

[56] References Cited

U.S. PATENT DOCUMENTS

| | | | |
|---|---|---|---|
| 2,600,151 | 6/1952 | Backus | 250/41.9 |
| 2,715,692 | 8/1955 | Cardwell | 313/63 |
| 3,518,484 | 6/1970 | Maskell | 315/111 |
| 3,583,361 | 6/1971 | Laudel | 204/192 N |
| 3,756,193 | 9/1973 | Carmichael et al. | 204/298 |
| 3,758,777 | 9/1973 | Brunnee et al. | 250/41.9 |
| 3,770,870 | 11/1973 | Kervizic et al. | 13/31 |
| 3,913,320 | 10/1975 | Reader et al. | 60/202 |
| 3,968,019 | 7/1976 | Hanazono et al. | 204/298 |
| 3,974,059 | 8/1976 | Murayama | 204/298 |
| 4,016,389 | 5/1977 | White | 204/298 |
| 4,039,416 | 8/1977 | White | 204/298 |
| 4,054,810 | 10/1977 | Beckey | 313/15 |
| 4,082,636 | 4/1978 | Takagi | 204/192 N |
| 4,140,546 | 2/1979 | Krimmel | 148/1.5 |
| 4,170,662 | 10/1979 | Weiss et al. | 204/298 |
| 4,197,175 | 4/1980 | Moll et al. | 204/192 R |
| 4,213,844 | 7/1980 | Morimoto et al. | 204/298 |
| 4,217,855 | 8/1980 | Takagi | 204/192 N |
| 4,227,961 | 10/1980 | Takagi | 204/192 N |
| 4,250,009 | 2/1981 | Cuomo et al. | 204/192 N |
| 4,367,429 | 1/1983 | Wang et al. | 313/362.1 |

OTHER PUBLICATIONS

Muramaya, Structures of GaAs and GaP Thin Films formed by RF Ion–Beam Epitaxy, J. Vac. Sci. Technol., vol. 12, No. 4, Jul./Aug. 1975, pp. 878-878.

*Primary Examiner*—Arthur P. Demers
*Attorney, Agent, or Firm*—Carl C. Kling

[57] ABSTRACT

Combining an evaporation source and an ion beam source to provide a crucible anode surface, and heating that crucible anode surface to a high enough temperature to cause evaporation of anode material, provides for emission of atoms and ions selectively and independently controllable and directed along the identical path. A high melting point material auxiliary anode, connected to the crucible anode by a variable resistance, provides independent control of the vapor flux by selectively shifting the discharge current from auxiliary anode to crucible anode.

The crucible anode contains the material which is to be evaporated. A gas plasma discharge is supplied between a heated cathode filament and the heated crucible anode. Electrons carrying a discharge current bombard the crucible anode material surface, causing a temperature rise which causes an increase in discharge current. At a high enough discharge current level, the anode material in the crucible anode melts and vaporizes, forming a stream which passes through an extraction grid to deposit vaporized anode material on a substrate.

The gas discharge generates ions, which are accelerated by voltages on the anodes, forming an ion beam which also strikes the substrate.

The flux of the ion beam is controlled by the discharge current. The ion energy is controlled by the anode power supply. Shifting a portion of the discharge current from the auxiliary anode to the crucible anode increases the amount of vapor flux for a given ion flux.

9 Claims, 1 Drawing Figure

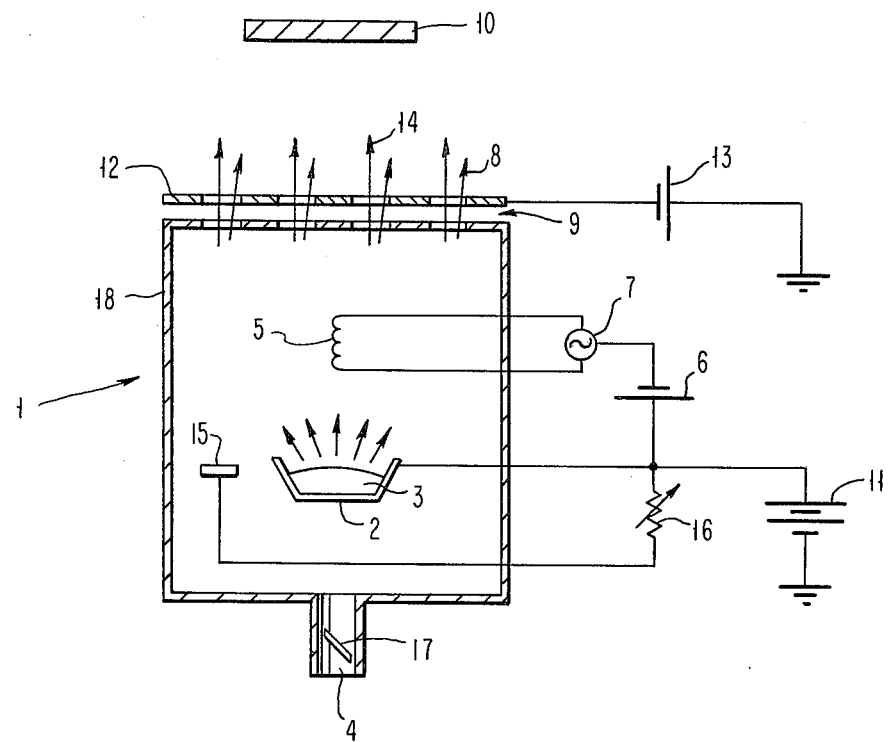

SINGLE AXIS COMBINED ION AND VAPOR SOURCE

BACKGROUND OF THE INVENTION

1. Field of the Invention

The invention relates to ion bombardment sources and in particular relates to a combined vapor deposition material and ion source crucible anode with its axis essentially normal to the substrate of deposition, and an auxiliary anode with independent control to provide a controllable relationship between ion flux and vapor flux by selectively diverting the discharge current from auxiliary anode to crucible anode.

2. Description of the Prior Art

U.S. Pat. No. 2,600,151, Backus, ION PRODUCING MECHANISM, June 1952, shows the use of a crucible anode with the anode material directly connected to a voltage source.

U.S. Pat. No. 2,715,692, Cardwell, ION PRODUCING APPARATUS, August 1955, shows the use in a calutron of finely divided charge material with the entire vaporization chamber serving as a crucible anode.

U.S. Pat. No. 3,404,084, Hamilton, APPARATUS FOR DEPOSITING IONIZED ELECTRON BEAM EVAPORATED MATERIAL ON A NEGATIVELY BIASED SUBSTRATE, October 1968, shows the use of variable voltage sources and apparatus for depositing ionized electron beam evaporated material on a negatively biased substrate. Accelerated ions, because of their energy, simultaneously clean the substrate surface and become deposited.

U.S. Pat. No. 3,518,484, Maskell, HOLLOW CATHODE DISCHARGE DEVICE WITH CONTROL ELECTRODE FOR ELECTRON BEAM FOCUSING, June 1970, shows a hollow cathode discharge device with a control electrode for electron beam focusing. The control electrode helps focus the beam to form a hollow beam converging at a region outside the cathode.

U.S. Pat. No. 3,758,777, Brunnee et al, ION SOURCE FOR VAPORIZING AND IONIZING SOLID SUBSTANCES, September 1973, shows a high vacuum ion source in which a body of deposition material is heated from behind.

U.S. Pat. No. 3,770,870, Kervizic et al, TURRET DEVICE FOR POSITIONING CRUCIBLES IN ION SOURCES, shows a turret device for successively introducing a number of crucibles containing different kinds of elements for sequential deposition.

U.S. Pat. No. 3,913,320, Reader et al, ELECTRON-BOMBARDMENT ION SOURCES, October 1975, shows an electron bombardment ion source with a screen grid with a potential approaching the anode during the initiation of ion production and a potential approaching that on the cathode during steady state ion production. This is achieved by interposing a resistance of appropriate value.

U.S. Pat. No. 4,054,810 Beckey, FIELD EMISSION ION SOURCE HAVING HEATED ANODE, October 1977, shows a field emission ion source utilizing local heating of the anode to prevent material from being adsorbed on the anode's surface. To provide local heating of the anode a direct current source and a current limiting variable resister are placed in circuit with the wires which support the anode. The variable resistor adjusts the anode current to a value sufficient to heat the anode to a temperature where adsorption on the anode of the material being ionized does not occur.

U.S. Pat. No. 4,140,546, Krimmel, METHOD OF PRODUCING A MONOCRYSTALLINE LAYER ON A SUBSTRATE, February 1979, shows a crucible anode in which anode material is heated by an electron beam from an electron gun for production of vapor particles of the anode material in an ion flux chamber. An auxiliary electrode is provided within the growth chamber in close proximity to the substrate surface and connected to a controllable high voltage source so that an electrical field is superimposed on the substrate surface having a component thereof in the plane containing such surface. Such an applied electrical field provides orientation of the matter accumulating on the substrate.

U.S. Pat. No. 4,197,175, Moll et al, METHOD AND APPARATUS FOR EVAPORATING MATERIALS IN A VACUUM COATING PLANT, April 1980, shows a technique for evaporating materials by bombarding a material to be evaporated with electrons generated by a low voltage arc discharge between a hot cathode and an anode.

U.S. Pat. No. 4,213,844, Morimoto et al, ION PLATING APPARATUS, July 1980, shows an ion plating apparatus having multiple vapor sources which sources are heated by resistance or electron beam to provide source material.

U.S. Pat. No. 4,250,009, Cuomo et al, ENERGETIC PARTICLE BEAM DEPOSITION SYSTEM, February 1981, shows a deposition technique for sputter deposition of positive and negative ions alternately or in a desired graded mixture, under control by a varying voltage.

U.S. Pat. No. 4,367,429, Wang, et al, ALLOYS FOR LIQUID METAL ION SOURCES, January 1983, shows liquid metal field ionization ion sources; shows the gas field ion source and the liquid metal ion source which differ in the mechanism used to feed atoms into the ionizing region. The liquid metal ion source has an electrostatically shaped point which is relatively insensitive to contaminants.

Murayama, STRUCTURES OF GaAs AND GaP THIN FILMS FORMED BY RF ION-BEAM EPITAXY, J. Vac. Sci. Technol. Vol. 12, No. 4, July/Aug. 1975, pp. 876-878, shows in a single deposition chamber an ion beam epitaxy system having two ion sources and an rf coil. Two metals in the two sources are separately vaporized and then ionized by the electron shower in the ionization chamber.

None of the items of prior art separately, nor any combination of known prior art, shows the technique of separately controlling ion flux and vapor flux in the chamber by providing an auxiliary anode with a variable potential.

SUMMARY OF THE INVENTION

Combining an evaporation source and an ion beam source to provide an anode source, and selectively heating that anode source to a high enough temperature to cause evaporation of anode source material, provides for vaporization or ion beam extraction selectively and independently controllable and directed along the identical path. A high melting point material auxiliary anode, connected to the crucible anode by a variable resistance, provides independent control of the vapor flux by selectively shifting the discharge current from auxiliary anode to crucible anode.

A small anode, shaped as a crucible, contains the material which is to be evaporated. A gas supply is provided to generate a gas plasma discharge between a heated cathode filament and the heated crucible anode source, which is a combined vaporization material source and ion beam source. Electrons carrying a discharge current flow through the discharge power supply and bombard the crucible anode source material surface, causing a rise in anode source temperature. The anode source temperature is increased by raising the cathode heater current, causing an increase in discharge current. At a high enough discharge current level, the anode source material in the crucible anode source vaporizes to form an evaporant stream which passes through an extraction grid to deposit vaporized anode material on a target substrate.

The discharge current generates gas ions which are accelerated by voltages on the anode and on an additional extraction grid to form an ion beam which also strikes the target substrate.

The flux of the ion beam is controlled by the discharge current. The ion energy is controlled by the anode power supply.

The auxiliary anode and variable resistance are used to gain independent control over the ion flux and vapor flux. The auxiliary anode is made of a high melting temperature metal such as tungsten and has a large enough area so that it can carry the discharge current without melting. By varying the resistance from low values up to high values the discharge current is shifted from the auxiliary anode increasingly to the crucible anode source, continuously increasing the amount of vapor flux of the source material in the crucible for the same ion flux.

BRIEF DESCRIPTION OF THE DRAWING

The FIGURE shows the single axis combined ion and vapor source of the invention in schematic presentation.

DESCRIPTION OF THE PREFERRED EMBODIMENTS

The FIGURE shows schematically a Kaufman type ion chamber 1 constructed with a crucible anode 2 which holds anode material 3 and is connected to a positive power supply. A gas supply 4 is provided to generate a gas discharge between the heated cathode filament 5 and the crucible anode 2.

The discharge current flows through the discharge power supply 6. Electrons carrying the discharge current bombard the surface of source material 3 in the crucible anode 2, causing source material 3 to rise in temperature.

The temperature of material 3 in crucible anode 2 is increased by raising the cathode heater current from power supply 7, which causes an increase in discharge current passing from cathode 5 to the crucible anode 2 and anode material 3. At high enough power levels anode source material 3 vaporizes to form an evaporant stream 8. Evaporant stream 8 passes through gaps in extraction grid 9.

As described above, the unit acts as an evaporator. In its other function, the unit operates as an ion source. The gas discharge generates ions which are accelerated by voltages on the crucible anode 2 (power supply 11) and the extraction grid 12 (power supply 13) to form an ion beam 14 which also strikes substrate 10.

The flux of the ion beam is controlled by the discharge current. The ion energy is controlled by the anode power supply 11. To gain independent control over the ion flux and vapor flux, an auxiliary anode 15 is provided, connected to crucible anode 2 by variable resistance 16. Auxiliary anode 15 is made of a high melting temperature metal such as tungsten and has a large enough area so that it can carry the discharge current without melting.

By varying the resistance of variable resistor 16 from low value (several ohms) up to high value (many kilohms) the discharge current is shifted from auxiliary anode 15 increasingly toward crucible anode 2, continuously increasing the amount of vapor flux of anode material 3 for the same ion flux in ion beam 14. In this way the vapor flux and ion flux are independently controlled.

SECOND EMBODIMENT

It is possible to operate without a gas feed. When high evaporation rates of anode material 3 are achieved, substantial ionization of ionized anode material 3 occurs in the discharge. These ions are also extracted into ion beam 14. At high power levels it is also possible to shut off gas feed 4 by means of stop valve 17 and sustain ion source operation on the vapor of anode material 3 alone. Ions of material 3 are also generated and may be extracted as an ion beam.

ALTERNATE EMBODIMENTS

Other embodiments of the invention include:
(1) Heating the walls 18 of ion device 1 to minimize condensation of anode material 3.
(2) Providing a mechanical linkage for moving the grids 9 away from the opening of ion device 1 to allow unobstructed evaporation, then moving grids 9 into place either before or after the operation as an ion source.
(3) Other configurations of the cathode 5; for example, cathodes may be supported around the walls 17 of chamber 1 to avoid obstructing the vapor flow.
(4) Multiple crucible anodes 2 with different anode materials 3 with a resistor divider circuit to control the composition of the vapor flux.
(5) Other grid designs, such as single mesh grids or no grids as in the Hall current ion source, may be used in appropriate circumstances.

METHOD

In each of the embodiments the electron current is directed at the anode material to cause a vapor flux by evaporation of anode material either independently of or simultaneously with ion beam extraction from the same anode material.

By feeding a reactive gas (such as $O_2$ or $N_2$) into the unit, reactive compounds of anode material 3 (such as oxides or nitrides of such material) can be directly deposited. Also, a beam of compound ions may be generated.

Complex sequences of ion bombardment and vapor deposition are possible with automatic alignment of each process. For example, in a Josephson junction fabrication of multiple steps, the following steps may be carried out:
(1) Clean base metal by argon ion sputtering.
(2) Oxidize by $O_2^+$ ion beam.
(3) Overcoat with counterelectrode from lead/bismuth anode material 3 in crucible anode 2 using hot anode evaporation, maintain some Ar+ ion beam to improve adhesion, control grain size and insure step coverage.

(4) Deposit passivation layer of silicon oxide by anode evaporation of silicon in presence of $O_2^+$ ion beam from the same unit.

Lithography steps may or may not be required between these steps depending on the design.

Variations of the single axis combined ion and vapor source may be carried out, by those skilled in the art, without departing from the spirit and scope of the invention identified in the following claims.

1. Apparatus for generating both vapor flux and ion flux—characterized by—
    (a) flux generating means, for simultaneously generating an ion flux and a vapor flux from a common source; and
    (b) control means, for varying the amount of said vapor flux for a given ion flux.

2. Apparatus for generating both vapor flux and ion flux, according to claim 1
    —further characterized in that—
    said control means comprises an auxiliary anode coacting with said flux generating means and comprises current control means in circuit with said auxiliary anode.

3. A single axis combined ion and vapor source having power sources including a dc power source, a heated cathode, an anode source of ionizable material and a distribution port for distributing ions and vapor of such ionizable material to a target—characterized by—
    (a) an auxiliary anode physically located in the vicinity of such anode source;
    (b) a variable resistance electrically connected to said auxiliary anode; and
    (c) power connecting means connecting the anode source and said variable resistance to the dc power source;
    whereby manipulation of said variable resistance device alters the voltage relationship between such anode source and said auxiliary anode and thereby alters the discharge current division, diverting selective amounts of discharge current to said auxiliary anode resulting in altered heating of the anode source, so as to vaporize selective amounts of the anode material of such anode source, thereby providing selective control of vapor flux for a given ion flux.

4. A single axis combined ion and vapor source according to claim 3,
    —further characterized in that—
    such anode source in turn comprises crucible anode means and anode material physically supported by said crucible anode means.

5. A single axis combined ion and vapor source according to claim 3,
    —further characterized in that—
    said auxiliary anode comprises anode material having a melting point differing substantially from the melting point of the anode source.

6. A single axis combined ion and vapor source according to claim 3,
    —further characterized by—
    means to supply ionizable gas selectively to the vicinity of the cathode and anode,
    whereby, after ionization has been commenced, gas may be shut off and ionization sustained on the vapor of anode material alone.

7. A single axis combined ion and vapor source according to claim 3,
    —further characterized by—
    a plurality of anode sources, comprising a plurality of source materials; and
    resistance divider means in circuit with said plurality of anode sources to provide for deposition of alloys of source materials as a function of the resistance relationships.

8. A single axis combined ion and vapor source according to claim 3,
    —further characterized by—
    a plurality of cathodes; and
    means mounting said plurality of cathodes external to the direct path of vapor flow from anode source to target.

9. A method for depositing material on a target, using a sequence or combination of vapor deposition and ionization effects, comprising the following steps:
    mounting the target in operative juxtaposition to a cathode and anode source in a vapor deposition and ionization environment;
    establishing an ionization current between cathode and anode source in such manner that the ionization current causes heating and consequential vaporization of material from the anode source; and
    selectively diverting a portion of the ionization current to an auxiliary anode to alter the heating and consequential vaporization rate of material from the anode source without altering the aggregate ionization current.

* * * * *